United States Patent
Tsai et al.

(10) Patent No.: US 8,085,174 B2
(45) Date of Patent: Dec. 27, 2011

(54) CURRENT-MODE DAC CAPABLE OF PROSPECTIVE CORRECTION

(75) Inventors: Tsung-Heng Tsai, Chiayi (TW); Jen-Hung Chi, Taichung County (TW)

(73) Assignee: National Chung Cheng University, Chia-Yi (TW)

( * ) Notice: Subject to any disclaimer, the term of this patent is extended or adjusted under 35 U.S.C. 154(b) by 77 days.

(21) Appl. No.: 12/801,291

(22) Filed: Jun. 2, 2010

(65) Prior Publication Data

US 2011/0187568 A1      Aug. 4, 2011

(30) Foreign Application Priority Data

Feb. 4, 2010 (TW) .............................. 99103405 A

(51) Int. Cl.
*H03M 1/06* (2006.01)
(52) U.S. Cl. ...................................... 341/118; 341/143
(58) Field of Classification Search ........... 341/118–160
See application file for complete search history.

(56) References Cited

U.S. PATENT DOCUMENTS

| | | | |
|---|---|---|---|
| 4,996,530 A * | 2/1991 | Hilton | 341/120 |
| 5,021,784 A * | 6/1991 | Groeneveld et al. | 341/120 |
| 5,757,625 A * | 5/1998 | Schoofs | 363/21.13 |
| 6,150,771 A * | 11/2000 | Perry | 315/291 |
| 7,514,989 B1 * | 4/2009 | Somerville et al. | 327/543 |
| 8,008,978 B2 * | 8/2011 | Deguchi | 331/1 R |

* cited by examiner

*Primary Examiner* — Lam T Mai
(74) *Attorney, Agent, or Firm* — Bacon & Thomas, PLLC

(57) ABSTRACT

A current-mode DAC includes at least one to-be-corrected one current source, a referential current source, a current comparator for comparing the current of the to-be-corrected current source and the current of the referential current source, a correction controller, a successive approximation register controller controlled by the correction controller and referring to the result of the comparison for carrying out successive approximation, and at least one correction DAC electrically connected with the successive approximation register controller and the to-be-corrected current source for referring to the result acquired from the successive approximation register controller and then providing a bias for the to-be-corrected current source for carrying out current correction. Accordingly, the corrected current can have the excellent accuracy.

7 Claims, 4 Drawing Sheets

CURRENT-MODE DAC CAPABLE OF PROSPECTIVE CORRECTION

BACKGROUND OF THE INVENTION

1. Field of the Invention

The present invention relates generally to a digital-analog converter (DAC), and more particularly, to a current-mode DAC capable of prospective correction.

2. Description of the Related Art

Recently, as the high-speed wireless local area network (WLAN) and the digital television are highly developed, the specification of the mixed-signal blocks with the applications of requiring high speed and high resolution for system is higher and higher. The requirement for the specification of the DAC is farther strict. Among the high-specification DACs, the current-mode DAC is the most appropriate.

Where the non-ideal effect is well-known, during the high-speed operation, the harmonic interference results in worse performance to further limit the spurious-free dynamic range (SFDR) of the DAC. Generally speaking, such error not only results from the mismatch of current source but the impedance generated due to the limited parasitic effect of the switching current source unit. Under the circumstances, further installing a transistor between the current source and the switch, as a conventional way, to improve that the impedance is insufficient to cause a second-harmonic wave while the signal is inputted under high frequency.

In addition, an accurate DAC design must have the static non-linear value (due to the random error of the manufacturing process) of its internal current source cell within the confined specification. In the prior art, a plurality of the current source cells are arranged in array, where the yield rate of the random error can define the gate area of the transistor included in each current source, and the gate area is subject to being greater, such that the parasitic effect of the internal contacts increases to lower the high-frequency SFDR. This problem has become a big issue for the high-speed operation. Although someone proposed the internal-inherent accuracy degree based on the gradient effect of the manufacturing-process error for cutting it into several arrays having symmetric centers in such a way that the equalization of the error is effected to decrease some gate area, there is still a drawback of insufficient accuracy of correction.

SUMMARY OF THE INVENTION

The primary objective of the present invention is to provide a current-mode DAC capable of prospective correction, which brings forth excellent accuracy of the current after corrected.

The foregoing objective of the present invention is attained by the current-mode DAC composed of at least one to-be-corrected one current source, a referential current source, a current comparator, a correction controller, a successive approximation register controller, and at least one correction DAC. The referential current source is electrically connected with the to-be-corrected current source. The current comparator is electrically connected with the referential current source and the to-be-corrected current source for comparing the current of the to-be-corrected current source and the current of the referential current source and then outputting the result of the comparison. The correction controller is electrically connected with the to-be-corrected current source. The successive approximation register controller is electrically connected with the current comparator and the correction controller and controlled by the correction controller, referring to the result of the comparison for carrying out successive approximation. The correction DAC corresponds to the to-be-corrected current source in number and is electrically connected with the successive approximation register controller and the to-be-corrected current source for referring to the result acquired from the successive approximation register controller and then providing a bias for the to-be-corrected current source for carrying out current correction.

DETAILED DESCRIPTION OF PREFERRED EMBODIMENTS

Figure 1:
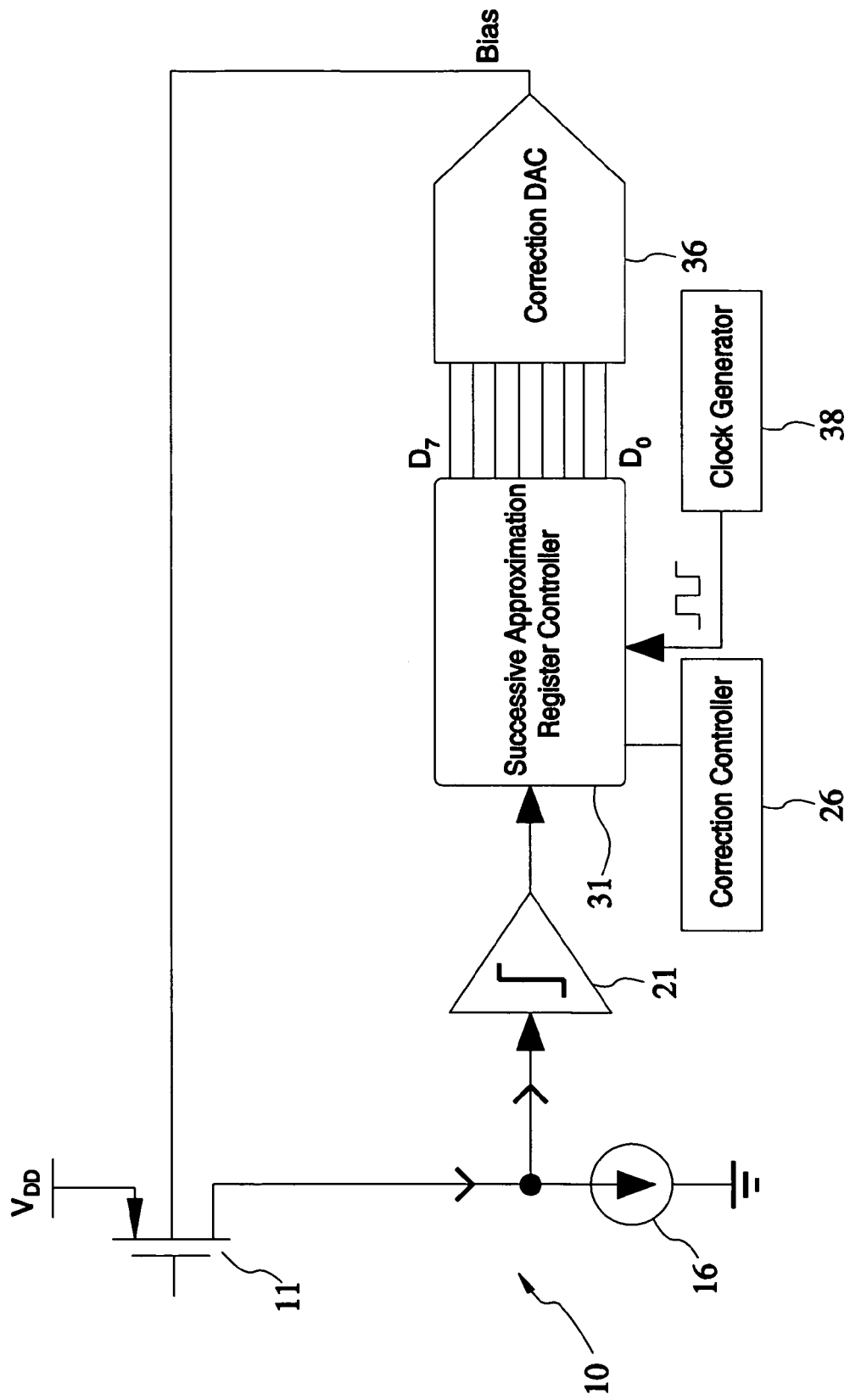
FIG. 1 is a circuit diagram of a first preferred embodiment of the present invention.

Referring to FIG. 1, a current-mode DAC 10 capable of prospective correction in accordance with a first preferred embodiment of the present invention is composed of a to-be-corrected current source 11, a referential current source 16, a current comparator 21, a correction controller 26, a successive approximation register controller 31, a correction DAC 36, and a clock generator 38. The details and interrelationships of the elements are recited in the following respective paragraphs.

The to-be-corrected current source 11 is a current-source transistor and specifically, is a metal oxide semiconductor field-effect transistor (MOSFET).

The referential current source 16 is electrically connected with the to-be-corrected current source 11.

The current comparator 21 is electrically connected with the referential current source 16 and the to-be-corrected current source 11 for comparing the current outputted from the to-be-corrected current source 11 and the current of the referential current source 16 and then outputting the result of the comparison.

The correction controller 26 is electrically connected with the to-be-corrected current source 11.

The successive approximation register controller 31 is electrically connected with the current comparator 21 and the correction controller 26 and controlled by the correction controller 26 and can refer to the result of the comparison for carrying out successive approximation. The successive approximation register controller 31 includes a plurality of pins as output; specifically, there are eight pins (D7-D0) for binary 8-bit variations.

Figure 2:
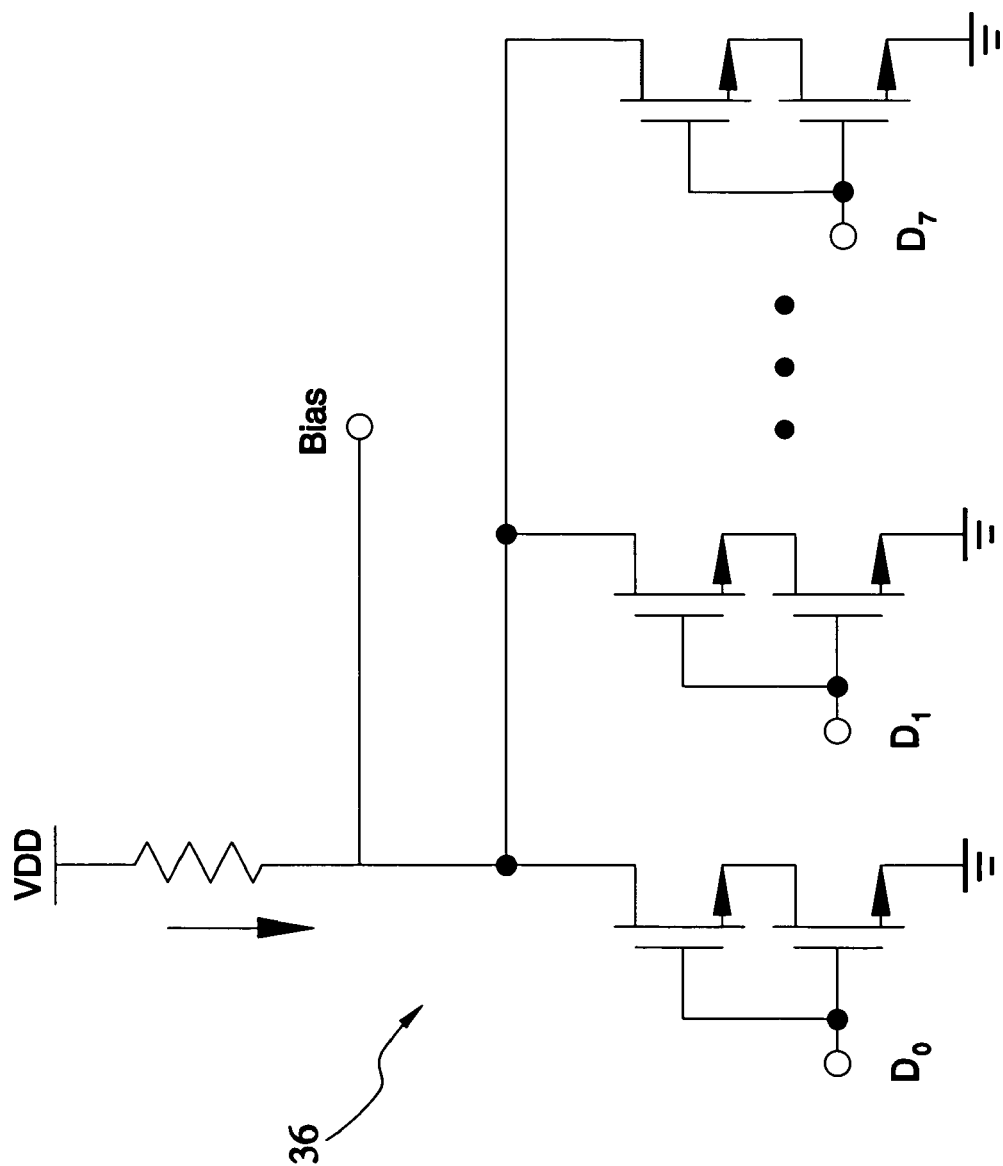
FIG. 2 is a circuit diagram of a part of the first preferred embodiment of the present invention.

The correction DAC 36 is electrically connected with the successive approximation register controller 31 and a body of the to-be-corrected current source 11 for referring to the result acquired from the successive approximation register controller 31 and then providing a bias for the body of the to-be-corrected current source 11 for further correction. The correction DAC 36 corresponds to the successive approximation register controller 31 to be an 8-bit binary switching-current-mode DAC. FIG. 2 illustrates the circuitry of the correction DAC 36, wherein D0-D7 indicates the positions corresponding to the eight pins of the c successive approximation register controller 31.

The clock generator 38 is electrically connected with the successive approximation register controller 31 for providing clock for the successive approximation register controller 31.

Next, the following paragraphs depict how the current-mode DAC 10 is operated.

First of all, the to-be-corrected current is generated from the to-be-corrected current source 11 via a feedback of the bias provide by the correction DAC 36. Adjusting the bias of the correction DAC 36 to adjust the body of the to-be-corrected current source 11 to further adjust the current generated by the to-be-corrected current source 11 for current correction.

If the range of the bias is set 1.7V-1.9V, the output current of the referential current source 16 is 200 μA. Because the amperage of the to-be-corrected current source 11 is 210 μA while the bias is 1.8V, the error (ΔI) between the output current of the to-be-corrected current source 11 and the output current of the referential current source 16 can fall within 0.1.

From the hypothesis mentioned above, the maximal bit switch of the bias is set 0.1V and its minimal bit switch is set 0.00078125V, so the corresponding output current variations of the to-be-corrected current source 11 are 30 μA and 0.234375 μA.

Because the 8-bit successive approximation register controller is applied to this embodiment, ten clocks generated by the clock generator 38 are needed for the current correction, wherein each clock is a transitional step of the process of the current correction shown in the following Table 1.

TABLE 1

| | Bit of Successive Approximation Register Controller | | | | | | | | Output of Current | | Current Generated by To-Be-Corrected |
|---|---|---|---|---|---|---|---|---|---|---|---|
| Step | D7 | D6 | D5 | D4 | D3 | D2 | D1 | D0 | Comparator | Bias | Current Source |
| 1 | 0 | 0 | 0 | 0 | 0 | 0 | 0 | 0 | — | 1.900000000 | 180.000000 |
| 2 | 1 | 0 | 0 | 0 | 0 | 0 | 0 | 0 | B1 = 0 | 1.800000000 | 210.000000 |
| 3 | B1 | 1 | 0 | 0 | 0 | 0 | 0 | 0 | B2 = 1 | 1.850000000 | 195.000000 |
| 4 | B1 | B2 | 1 | 0 | 0 | 0 | 0 | 0 | B3 = 0 | 1.825000000 | 202.500000 |
| 5 | B1 | B2 | B3 | 1 | 0 | 0 | 0 | 0 | B4 = 1 | 1.837500000 | 198.750000 |
| 6 | B1 | B2 | B3 | B4 | 1 | 0 | 0 | 0 | B5 = 0 | 1.843750000 | 200.625000 |
| 7 | B1 | B2 | B3 | B4 | B5 | 1 | 0 | 0 | B6 = 1 | 1.840625000 | 199.687500 |
| 8 | B1 | B2 | B3 | B4 | B5 | B6 | 1 | 0 | B7 = 0 | 1.842187500 | 200.156250 |
| 9 | B1 | B2 | B3 | B4 | B5 | B6 | B7 | 1 | B8 = 1 | 1.841406250 | 199.921875 |
| 10 | 0 | 1 | 0 | 1 | 0 | 1 | 0 | 1 | — | 1.841406250 | 199.921875 |

The process indicated in the Table 1 is specified below.

Step 1: Reset all of the output bits of the successive approximation register controller 31 to 0. Set the bias to 1.9V. Set the current generated by the to-be-corrected current source 11 to 180 μA.

Step 2: Set the signal of the maximal bit D7 of the successive approximation register controller 31 to 1 and set the bias to 1.8V. In the meantime, the amperage of the current generated by the to-be-corrected current source 11 is 210 μA that is greater than that of the referent current (200 μA). Under the circumstances, the output of the current comparator 21 is zero, i.e. B1=0 indicated in the Table 1.

Step 3: Save the output B1 of the current comparator 21 in the step 2 to the maximal bit D7 of the successive approximation register controller 31 and then move the signal (1) of the maximal bit in the step 2 to the next bit D6, such that the output of the successive approximation register controller 31 is 01000000 and the bias is set to 1.85V. In the meantime, the amperage of the current of the to-be-corrected current source 11 is 195 μA that is less than that of the referential current (200 μA). Under the circumstances, the output of the current comparator 21 is one, i.e. B2=1 indicated in the Table 1.

Step 4: Save the output B2 of the current comparator 21 in the step 3 to the bit D6 of the successive approximation register controller 31 and then move the signal (1) of the bit D6 in the step 3 to the next bit D5, such that the output of the successive approximation register controller 31 is 01100000 and the bias is set to 1.825V. In the meantime, the amperage of the current of the to-be-corrected current source 11 is 202.5 μA that is greater than that of the referential current (200 μA). Under the circumstances, the output of the current comparator 21 is zero, i.e. B3=0 indicated in the Table 1.

Step 5: Save the output B3 of the current comparator 21 in the step 4 to the bit D5 of the successive approximation register controller 31 and then move the signal (1) of the bit D5 in the step 4 to the next bit D4, such that the output of the successive approximation register controller 31 is 01010000 and the bias is set to 1.8375V. In the meantime, the current of the to-be-corrected current source 11 is 198.75 μA that is less than the referential current (200 μA). Under the circumstances, the output of the current comparator 21 is one, i.e. B4=1 indicated in the Table 1.

Step 6: Analogized as per the above, referring to the Table 1.
Step 7: Analogized as per the above, referring to the Table 1.
Step 8: Analogized as per the above, referring to the Table 1.
Step 9: Analogized as per the above, referring to the Table 1.

Step 10: Save the output D8 of the current comparator 21 in the step 9 to the minimal bit D0 of the successive approximation register controller 31 and then lock the output of the successive approximation register controller 31 and the bias is set to 1.84140625V; meanwhile, the current of the to-be-corrected current source 11 is 199.921875 μA.

From the result of the above current correction, the amperage of the final current of the to-be-corrected current source 11 is 199.921875 μA. The error between this current and the referential current is 0.078125 μA, such that the previously set accuracy and result of the current correction are reached.

Figure 3:
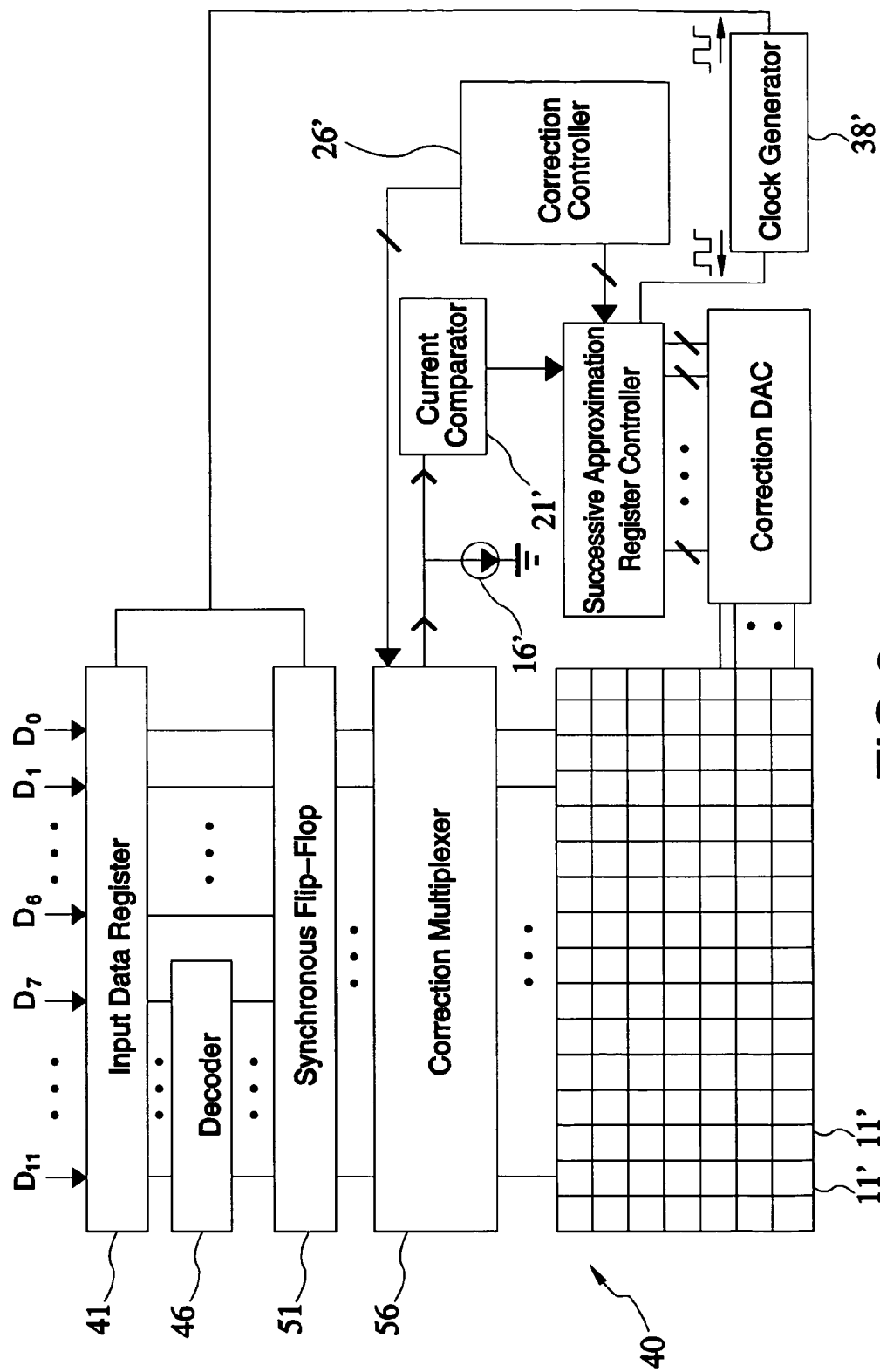
FIG. 3 is a circuit diagram of a second preferred embodiment of the present invention.

Referring to FIG. 3, a current-mode DAC 40 capable of prospective correction in accordance with a second preferred embodiment of the present invention is similar to that of the first embodiment, having the difference recited in the following paragraphs.

The to-be-corrected current source 11' is plural in number and located in an integrated circuit (IC) chip. The to-be-corrected current sources 11' are encoded in 12-bit and composed of a binary 7-bit and a single 5-bit. The binary 7-bit is the forepart of the 12-bit encoding and the 5 bit is the rear part of the 12-bit encoding.

Figure 4:
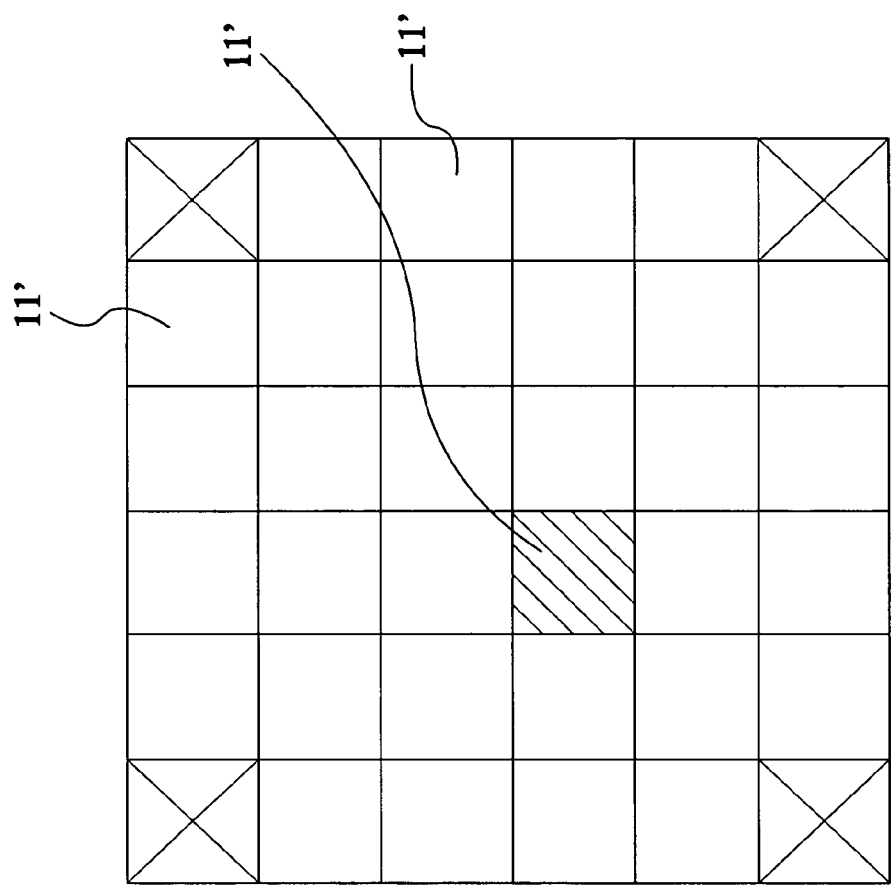
FIG. 4 is a schematic view of second preferred embodiment of the present invention.

The forepart of the 12-bit encoding is composed of 127 minimal unit current sources (not shown) plus one minimal unit current source to become one of the to-be-corrected current sources 11', being the prior art in the IC layout technology so that no more descriptions and drawings are necessary for illustration. The aforesaid rear part of the 12-bit encoding is composed of 31 to-be-corrected current sources 11' plus the to-be-corrected current sources 11' composed of the 128 the minimal unit current sources to jointly become 32 to-be-corrected current sources 11' arranged in the IC shown in FIG. 4, in which each checker indicates one of the to-be-corrected current sources 11' and the checkers at four corners in the 6×6 matrix are excluded. Besides, the checker having slopes in FIG. 4 indicates the to-be-corrected current source 11' composed of the 128 minimal unit current sources. While it is intended to do the prospective correction, the correction is applied to the 32 to-be-corrected current sources 11'.

The current-mode DAC 40 of the second embodiment further includes an input data register 41, a decoder 46, a synchronous flip-flop 51, and a correction multiplexer 56. The input data register 41 is electrically connected with the to-be-corrected current sources 11' and the minimal unit current source (not shown) for temporarily saving the current outputted by the to-be-corrected current sources 11'. The decoder 46 is electrically connected with the to-be-corrected current sources 11' but not connected with the minimal unit current sources. The synchronous flip-flop 51 is electrically connected with the decoder 46 and the output data register 41. The correction multiplexer 56 is electrically connected with the synchronous flip-flop 51, the referential current source 16', the current comparator 21', and the correction controller 26'. The correction multiplexer 56 is to output the current of the to-be-corrected current sources 11' to the current comparator 21' in turn. The input data register 41 and the synchronous flip-flop 51 are electrically connected with the clock generator 38' for receiving the clock of the clock generator 38'.

The input data register 41 is to receive the current of the to-be-corrected current sources 11' and the minimal unit current sources. The current of the to-be-corrected current sources 11' is decoded through the decoder 46 and then enters the synchronous flip-flop 51 from the input data register 41. The current of the minimal unit current sources directly enters the synchronous flip-flop 51 without passing through the decoder 46. When the current of the to-be-corrected current sources 11' and the current of the minimal unit current sources enter the synchronous flip-flop 51, one of the to-be-corrected current source 11' and the minimal unit current source enters the synchronous flip-flop 51 passes through the decoder 46 and the other does not, such that there are some errors or delays in time. Controlling the receiving speed or time of the synchronous flip-flop 51 by the clock of the clock generator 38' can avoid such errors or delays. The synchronous flip-flop 51 can input the current of the to-be-corrected current sources 11' into the correction multiplexer 56 and then the correction multiplexer 56 can output the current of the to-be-corrected current sources 11' to the current comparator 21' in turn. Next, the current correction can be applied to the each of the to-be-corrected current sources 11' in turn according to the steps of the process mentioned in the first embodiment. Since the other elements and operational manners are identical to those of the first embodiment, no more recitation is necessary.

In conclusion, the present invention is applicable to correction of one single or multiple current sources and can adjust the bias of the current-source transistor before the operation, i.e. prospectively. By means of the successive approximation register, the error between the corrected current and the referential current is minimal, such that excellent accuracy of the current correction can be reached by the present invention.

Although the present invention has been described with respect to specific preferred embodiments thereof, it is in no way limited to the specifics of the illustrated structures but changes and modifications may be made within the scope of the appended claims.

What is claimed is:

1. A current-mode DAC capable of prospective correction, comprising:
    at least one to-be-corrected current source;
    a referential current source electrically connected with the at least one to-be-corrected current source;
    a current comparator electrically connected with the referential current source and the at least one to-be-corrected current source for comparing the current outputted by the at least one to-be-corrected current source and the current of the referential current and outputting the result of the comparison;
    a correction controller electrically connected with the to-be-corrected current source;
    a successive approximation register controller electrically connected with the current comparator and the correction controller and controlled by the correction controller and referring to the result of the comparison from the current comparator for successive approximation; and
    at least one correction DAC, whose number corresponds to that of the at least one to-be-corrected current source, and electrically connected with the successive approximation register controller and the at least one to-be-corrected current source for providing a bias for the at least one to-be-corrected current source by reference to the result of the comparison for carrying out current correction.

2. The current-mode DAC as defined in claim 1, wherein the successive approximation register controller further comprises a plurality of pins for output and for connection with the correction DAC, the pins being acted as successively approximating binary bits.

3. The current-mode DAC as defined in claim 2, wherein the pins are eight in number.

4. The current-mode DAC as defined in claim 1, wherein the at least one to-be-corrected current source is an MOSFET and the bias is applied to a body of the to-be-corrected current source connected with the correction DAC.

5. The current-mode DAC as defined in claim 1 further comprising a clock generator electrically connected with the successive approximation register controller.

6. The current-mode DAC as defined in claim 5, wherein the at least to-be-corrected current source is plural in number and located in an IC.

7. The current-mode DAC as defined in claim 6 further comprising an input data register, a decoder, a synchronous flip-flop, and a correction multiplexer, the input data register being electrically connected with the to-be-corrected current sources, the decoder being electrically connected with some of the to-be-corrected current sources, the synchronous flip-flop being electrically connected with the decoder and the input data register, the correction multiplexer being electrically connected with the synchronous flip-flop, the referential current source, the current comparator, and the correction controller for outputting the current of the to-be-corrected current sources to the current comparator.

\* \* \* \* \*